(12) United States Patent
Dudek

(10) Patent No.: US 10,825,734 B2
(45) Date of Patent: Nov. 3, 2020

(54) METHOD FOR FABRICATING A SEMICONDUCTOR DEVICE AND A SEMICONDUCTOR DEVICE

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

(*) Notice: Subject to any disclaimer, the term of this patent is extended or adjusted under 35 U.S.C. 154(b) by 0 days.

(21) Appl. No.: 16/414,818

(22) Filed: May 17, 2019

(65) Prior Publication Data
US 2019/0355622 A1    Nov. 21, 2019

(30) Foreign Application Priority Data

May 17, 2018   (DE) .......................... 10 2018 003 982

(51) Int. Cl.
*H01L 21/784* (2006.01)
*H01L 21/02* (2006.01)
(Continued)

(52) U.S. Cl.
CPC ...... *H01L 21/784* (2013.01); *H01L 21/02274* (2013.01); *H01L 21/02546* (2013.01);
(Continued)

(58) Field of Classification Search
CPC ............ H01L 21/784; H01L 21/02274; H01L 21/02546; H01L 21/2654; H01L 21/266;
(Continued)

(56) References Cited

U.S. PATENT DOCUMENTS 5,574,738 A    11/1996  Morgan
5,764,674 A *  6/1998  Hibbs-Brenner ...... B82Y 20/00
                                                 372/46.01
(Continued)

FOREIGN PATENT DOCUMENTS

JP    S63124492 A    5/1988
JP    H11307876 A    11/1999
(Continued)

OTHER PUBLICATIONS

Ziegler, J.F.:"High Energy Ion Implantation. In: Nuclear Instruments and Methods in Physics Research", B6, 1985, S. 270-282.— ISSN 0168-583X.
(Continued)

*Primary Examiner* — Tong-Ho Kim
(74) *Attorney, Agent, or Firm* — Muncy, Geissler, Olds & Lowe, P.C.

(57) ABSTRACT

A method and stacked semiconductor device having a top surface, a bottom surface, and at least one side surface that connects the top surface with the bottom surface. The bottom surface is formed of a substrate layer or a rear side contact layer arranged below the substrate layer. On the substrate layer, a first semiconductor layer of a first conductivity type is arranged and on the first semiconductor layer at least one second semiconductor layer of a second conductivity type is arranged. The first and second semiconductor layers are formed of a III-V material or consist of a III-V material. The first and second conductivity types are different. The top surface is at least partially formed by a passivation layer. Along the side surface, an amorphized and/or insulating region extending to a depth is formed, and the depth is perpendicular or substantially perpendicular to the layer stack.

19 Claims, 1 Drawing Sheet

(51) Int. Cl.

| | |
|---|---|
| *H01L 21/266* | (2006.01) |
| *H01L 21/265* | (2006.01) |
| *H01L 29/40* | (2006.01) |
| *H01L 21/306* | (2006.01) |
| *H01L 23/31* | (2006.01) |
| *H01L 29/20* | (2006.01) |
| *H01L 29/45* | (2006.01) |
| *H01L 23/29* | (2006.01) |
| *H01L 29/66* | (2006.01) |
| *H01L 29/739* | (2006.01) |
| *H01L 29/861* | (2006.01) |

(52) U.S. Cl.
 CPC ........ *H01L 21/266* (2013.01); *H01L 21/2654* (2013.01); *H01L 21/30612* (2013.01); *H01L 23/3171* (2013.01); *H01L 29/20* (2013.01); *H01L 29/401* (2013.01); *H01L 29/452* (2013.01); *H01L 21/0217* (2013.01); *H01L 21/02164* (2013.01); *H01L 23/291* (2013.01); *H01L 29/66204* (2013.01); *H01L 29/66333* (2013.01); *H01L 29/7395* (2013.01); *H01L 29/861* (2013.01)

(58) Field of Classification Search
 CPC ......... H01L 21/30612; H01L 21/02164; H01L 21/217; H01L 23/3171; H01L 23/291; H01L 29/20; H01L 29/401; H01L 29/452; H01L 29/66204; H01L 29/66333; H01L 29/7395; H01L 29/861
 USPC .......................................................... 257/769
 See application file for complete search history.

(56) References Cited

U.S. PATENT DOCUMENTS

| | | | |
|---|---|---|---|
| 6,055,258 A | * | 4/2000 | Beyea .................. H01S 5/20 257/97 |
| 2003/0211642 A1 | | 11/2003 | Nohava et al. |
| 2005/0130390 A1 | | 6/2005 | Andrews et al. |
| 2008/0032488 A1 | | 2/2008 | Chu et al. |
| 2013/0064497 A1 | | 3/2013 | Iwai et al. |

FOREIGN PATENT DOCUMENTS

| | | |
|---|---|---|
| JP | 2002222777 A | 8/2002 |
| JP | 2013070027 A | 4/2013 |

OTHER PUBLICATIONS

D'Avanzo, D.C.:Proton Isolation for GaAs Integrated Circuits. In: IEEE Transactions on Microwavt Theory and Techniques, MTT-30, No. 7, 1982, S.955-963.—ISSN 001 8-9480.

\* cited by examiner

METHOD FOR FABRICATING A SEMICONDUCTOR DEVICE AND A SEMICONDUCTOR DEVICE

This nonprovisional application claims priority under 35 U.S.C. § 119(a) to German Patent Application No. 10 2018 003 982.0, which was filed in Germany on May 17, 2018, and which is herein incorporated by reference.

BACKGROUND OF THE INVENTION

Field of the Invention

The present invention relates to a method for fabricating a semiconductor device and to a semiconductor device.

Description of the Background Art

For the fabrication of semiconductor devices, typically, complete semiconductor disks, also called wafers, are processed and subsequently diced into individual chips.

The dicing is carried out, for example, by sawing, scribing, breaking, by means of a laser or by means of plasma etching or a combination of said methods.

Generally, etching is carried out along a scribe line from the top of the wafer, down to the substrate. The etching process is also known as Mesa etching. Subsequently, the substrate is sawed through. In general, the etched trenches are wider than the saw and a peripheral margin is formed.

SUMMARY OF THE INVENTION

It is therefore an object of the present invention to provide a method and a device that further develops the prior art.

In an exemplary embodiment of the invention a method of fabricating a semiconductor device is provided, wherein a semiconductor semi-finished product with a top surface and a bottom is provided.

The semiconductor semi-finished product comprises a plurality of mutually adjacent, stacked semiconductor devices, wherein the semiconductor devices in each case can have a substrate layer comprising a III-V material or germanium.

The substrate layer can be disposed on or near the bottom. On the substrate layer, a first semiconductor layer of a first conductivity type can be arranged.

On the first semiconductor layer, at least a second semiconductor layer of a second conductivity type can be arranged, wherein the two semiconductor layers each comprise a III-V material or consist of a III-V material, and the two conductivity types are different.

Between two immediately adjacent semiconductor devices, a scribe line having a width L1 can be formed on the top surface of the semiconductor semi-finished product.

The semiconductor devices are diced along the scribe line.

Prior to dicing, a mask layer which covers the semiconductor devices, leaving at least a portion of the scribe line uncovered, is applied to the top surface of the semiconductor semi-finished product.

After applying the mask layer, ion implantation is carried out for purposes of insulation and/or at least partial amorphization.

Ion implantation comprises at least one implantation step with an energy of at least 500 keV.

After the ion implantation, the mask layer is removed. After the mask layer is removed, the semiconductor devices are diced. As a further object of the invention, a stacked semiconductor device is provided.

The stacked semiconductor device has a top surface and a bottom. Furthermore, the semiconductor device has a side surface connecting the top surface with the bottom. The bottom is formed by the substrate layer and/or the rear side contact layer arranged below the substrate layer.

On the substrate layer, in each case a first semiconductor layer of a first conductivity type is arranged. On the first semiconductor layer, at least a second semiconductor layer of a second conductivity type is arranged.

The two semiconductor layers comprise a III-V material or consist of a III-V material. The two conductivity types are different, i.e., they have a different polarity.

Along the side surface, an amorphized and or insulating region extending up to a certain depth is formed. The direction of the depth is substantially perpendicular to the layer stacks.

The areas of the top surface of the semiconductor semi-finished product, i.e., the wafer, are called a scribe line, along which the semiconductor semi-finished product is to be split or diced.

By means of the scribe line, the plurality of individual device structures formed on the semiconductor wafer are separated from each other.

The mask layer leaves the scribe line uncovered, i.e., the mask layer has corresponding openings. The openings allow for areas between immediately adjacent devices to remain accessible.

For example, in addition to the implantation regions, the position and in particular the width of the scribe line can also be specified by means of the mask layer, i.e., by the width of the openings in the mask layer.

The ion implantation at least partially destroys the crystal structure and the conductivity in the area of the scribe line. It goes without saying that in all subsequent, if applicable, processing steps of the semiconductor semi-finished product, the temperature cannot be so high that the crystal defects produced by the implantation in the implanted regions of the scribe line are again annealed. In other words, unless annealing steps are carried out after the ion implantation, the region of the scribe line will remain partially or completely insulated up to a depth predetermined by the depth of penetration of the ions. It is understood that the width required for dicing, in particular if done by sawing, is less than the width of the area irradiated with the ion implantation.

The side surfaces and lateral areas or edges resulting from the dicing are electrically insulating.

As long as no Mesa etching is performed, preferably vertical side surfaces are formed during the dicing, for example by sawing. Most preferably, the side surfaces can be completely vertical.

An advantage is that, especially in high-barrier devices with a reverse voltage in excess of 100 V or above 1000 V, leakage currents or shunts beyond the edge are effectively suppressed.

Another advantage of the process according to the invention is that the portion of the scribe line is virtually flat or completely flat up to the point of dicing, and that no Mesa etching, or in an alternative embodiment only a brief Mesa etching, is performed prior to dicing. Another advantage is that even semiconductor devices with a stack height of more than 50 µm can be easily and reliably separated from each other without the need for elaborate and problematic Mesa etching processes.

Another advantage is that amorphization can help suppress stresses on the semiconductor devices caused by dicing.

According to an exemplary embodiment, the first semiconductor layer and the second semiconductor layer can each comprise a GaAs compound or consist of a GaAs compound.

In a further embodiment, by means of ion implantation, a deep region between the top surface of the semiconductor semi-finished product and the first semiconductor layer, or a deep region between the top surface of the semiconductor semi-finished product up to and including the second semiconductor layer, or a deep region between the top surface of the semiconductor semi-finished product up to the substrate layer, is amorphized and/or insulated.

Hydrogen ions or helium ions can be implanted.

An acceleration energy of the ions during implantation can be changed between a minimum value and a maximum value, wherein the minimum value is at least 50 keV and the maximum value is at most 300 MeV.

The maximum value and the minimum value determine the maximum or minimum depth of penetration of the ions. The change in energy is preferably continuous but can also be carried out stepwise or in any other way.

An implantation dosage during implantation can be between $10^{10}$ N/cm$^{-2}$ and $10^{16}$ N/cm$^{-2}$.

The mask layer can be removed before or after the sawing by means of an etching process. In particular, wet chemical methods apply.

The etching process can be subject to the material of the mask layer. Thus, a mask layer formed of aluminum can, for example, be removed by means of hydrochloric acid or hydrogen chloride (HCl); a titanium mask layer, for example, by means of sulfuric acid (H2SO4).

In an embodiment, before applying the mask layer, the semiconductor semi-finished product has metallic contact surfaces on the top surface and/or on the bottom. The contact surfaces on the top surface and/or on the bottom can comprise gold and/or palladium.

It is possible for the metallization, i.e., the application of contact surfaces, for example pads and/or conductive tracks, to be carried out only after implantation and after the removal of the mask layer. In this case, the mask layer also covers the contact surfaces on the top surface.

In another development, before applying the mask layer, the top surface of the semiconductor semi-finished product can be coated by means of chemical vapor deposition with a passivation layer having a layer thickness of at least 100 nm.

The top surface of the semiconductor semi-finished product can also be partially or is completely formed by the passivation layer and the mask layer is respectively disposed on the passivation layer.

Applying the passivation layer prior to implantation simplifies the fabrication process in that the passivation layer also serves as an etch stop layer for the later removal of the mask layer.

The semiconductor wafer is processed virtually completely, and the mask layer can be easily removed after implantation, for example by means of a dry etching process or a wet chemical etching process.

The passivation layer can be applied in a plasma-enhanced manner (PECVD). For example, the passivation layer comprises SiO2 or Si3N4.

Prior to applying the mask layer, the passivation layer can be removed by means of dry etching from at least one of the contact surfaces arranged on the top surface of the semiconductor semi-finished product.

By means of the ion implantation, the scribe line can be amorphized and/or formed insulating over a width of at least 30 μm and at most 300 μm.

The width of the scribe line can be determined by the width of the opening in the mask layer. It is understood that as a result, the scribe line is amorphized over the entire width.

A metal can be used for the mask layer, in particular titanium or aluminum. An advantage of using a metal mask is the low penetration depth of the ions with regard to the semiconductor layers. This way, the semiconductor regions formed under the mask layer are reliably protected from damage or amorphization even at high energies.

The first semiconductor layer and the second semiconductor layer can each comprise a GaAs compound or consist of a GaAs compound.

The depth of the partial or complete amorphization/insulation can be at least 0.5 μm or at least 5 μm or at least 30 μm or, alternatively, a deep region between the top surface up to the first semiconductor layer or a deep region between the top surface up to and including the second semiconductor layer or a deep region between the top surface up to the substrate layer is formed. The entire partially or completely amorphized/insulated region of the scribe line is also referred to below as the intermediate region.

The mask layer can be disposed directly on the uncovered metallic contact surfaces. Preferably, the metal of the contact surfaces is chemically selective against a wet chemical etching step for removing the metallic mask layer, e.g., with HCl. This simplifies fabrication and reduces fabrication costs.

The semiconductor device can have a height H1 of at least 100 μm and at most 1000 μm. Preferably, the device comprises a high-barrier GaAs power diode with a reverse voltage above 600 volts or an IGBT with a reverse voltage above 500 V.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
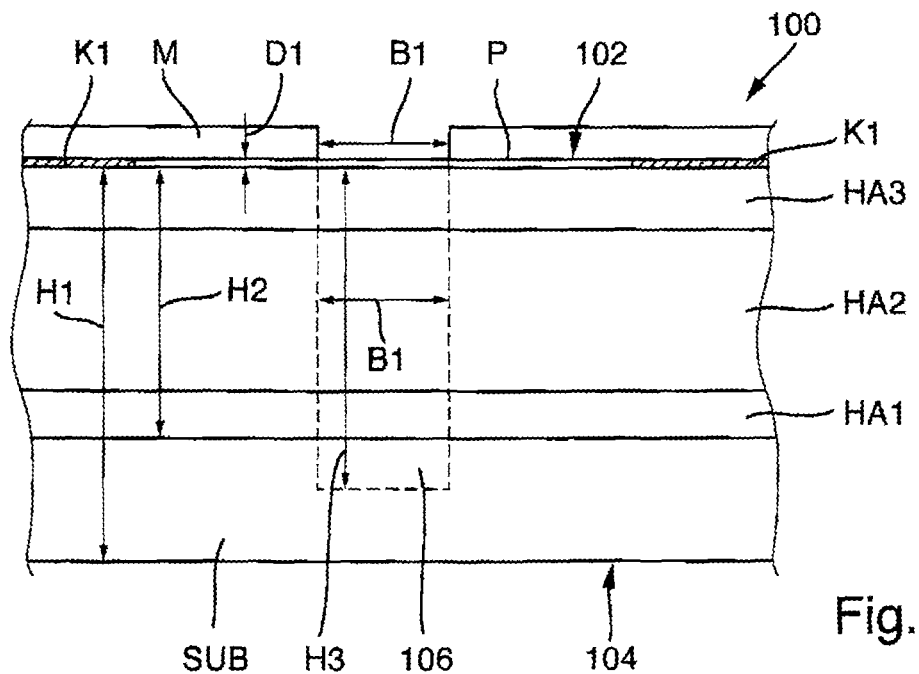
FIG. 1 illustrates a section of a disk-shaped semiconductor semi-finished product.

The illustration in FIG. 1 shows a section of a first embodiment of a disk-shaped semiconductor semi-finished product 100, having a top surface 102 and a bottom 104. The semiconductor semi-finished product 100 has a total height H1 from the bottom 104 to the top surface 102.

The bottom 104 is formed by a substrate layer SUB. On the substrate layer SUB, three semiconductor layers HA1, HA2, HA3 are arranged in a stacked manner. The semiconductor layers HA1, HA2 and HA3 together have a height H2. On the top surface of the topmost semiconductor layer H3, several contact surfaces K1 are disposed. The contact surfaces K1 include a pad and conductive tracks. The portion of the top surface of the uppermost semiconductor layer HA3 that is not covered by contact surfaces K1 and a portion of the contact surfaces, namely the conductive tracks, are coated with a passivation layer P having a thickness D1, so that the top surface 102 of the semiconductor semi-finished product 100 is formed from the passivation layer P and the uncovered portion of the contact surfaces K1, i.e., the pads.

On the top surface 102 of the semiconductor semi-finished product, a structured mask layer M is arranged. The mask layer M leaves several scribe lines with a line width L1 uncovered on the top surface 102. The mask layer thus does not cover the scribe line and only covers the remaining portion of the top surface 102, i.e., has corresponding windows.

Adjoining along the scribe line is an intermediate region 106, shown in dashed lines, which extends into the semiconductor semi-finished product. The intermediate region 106 has a height H3, wherein the height H3 is greater than or equal to the sum of the height H2 of the semiconductor layers HA1, HA2 and HA3 and the thickness D1 of the passivation layer P. A width B1 of the intermediate layer corresponds to the width B1 of the scribe line or the width of the window of the mask layer M. The semiconductor material in the intermediate region 106 is amorphized and/or insulating by means of an ion implantation.

After the dicing of the semiconductor semi-finished product 100, for example by sawing along the scribe line, and removal of the mask layer 100, for example by dry etching, an inventive stacked semiconductor device with amorphized and/or insulating side surfaces is fabricated.

Figure 2:
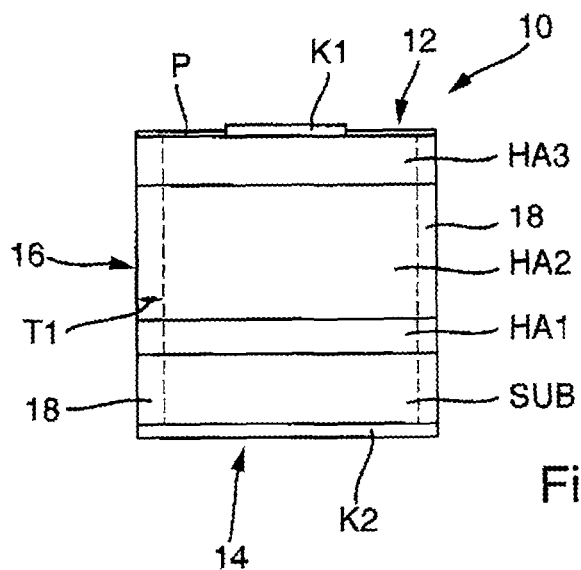
FIG. 2 illustrates a stacked semiconductor device.

FIG. 2 shows a first embodiment of an inventive stacked semiconductor device 10. The semiconductor device 10 has a top surface 12, a bottom 14 and four side surfaces 16 which connect the top 12 with the bottom 14.

The semiconductor device 10 comprises a stack made up of a substrate layer, followed by a first semiconductor layer HA1, a second semiconductor layer HA2, and a third semiconductor layer HA3. On a top surface of the third semiconductor layer HA3, a contact pad is arranged as a contact surface K1. The portion of the top surface of the third semiconductor layer HA3 that is not covered by the contact surface K1 is coated with a passivation layer P. The passivation layer P and the contact surface K1 form the top surface 12 of the semiconductor device 10. A bottom of the substrate layer SUB is completely coated with a contact layer as a rear side contact K2. The rear side contact K2 forms the bottom 14 of the semiconductor device 10.

A region 18 of the semiconductor device 10 extending from the top surface 12 along the four side surfaces 14 up to the second contact surface K2 and from each side surface 16 to a depth T1 is amorphized and/or insulating by means of implantation, wherein the depth T1 extends in each case perpendicular to the respective side surface.

Figure 3:
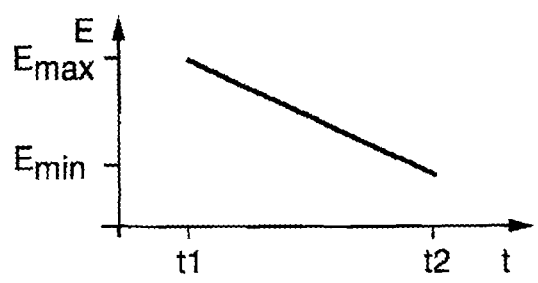
FIG. 3 is a diagram of the acceleration energy of the ions according to an exemplary embodiment of the inventive method of fabricating a semiconductor device.

In the illustration of FIG. 3, according to a first embodiment of the inventive method of fabricating a semiconductor device, an acceleration energy of the ions as a function of the time required for implantation is shown. The implantation of ions for generating amorphized intermediate regions along the scribe line of a wafer starts at a time t1 and ends at a time t2. At the beginning, the ions have an acceleration energy $E_{max}$, then the acceleration energy is continuously reduced until at the time t2, the acceleration energy only has a value $E_{min}$.

The invention being thus described, it will be obvious that the same may be varied in many ways. Such variations are not to be regarded as a departure from the spirit and scope of the invention, and all such modifications as would be obvious to one skilled in the art are to be included within the scope of the following claims

What is claimed is:

1. A method of fabricating a semiconductor device, the method comprising:
providing a semiconductor semi-finished product having a top surface and a bottom surface, the semiconductor semi-finished product having a plurality of mutually adjacent stacked semiconductor devices, wherein the semiconductor devices have a substrate layer with a III-V material or with germanium and the substrate layer being disposed on or near the bottom surface;
arranging on the substrate layer, a first semiconductor layer of a first conductivity type and arranging on the first semiconductor layer at least one second semiconductor layer of a second conductivity type, wherein the first and second semiconductor layers are formed of a III-V material or consist of a III-V material and the first and second conductivity types are different;
forming between two immediately adjoining semiconductor devices, a scribe line with a width on the top surface of the semiconductor semi-finished product;
dicing the semiconductor devices along the scribe line;
applying to the top surface of the semiconductor semi-finished product, prior to dicing, a mask layer that covers the semiconductor devices and leaves at least a portion of the scribe line uncovered;
performing, after applying the mask layer, ion implantation for at least partial amorphization and/or insulation, and the ion implantation has at least one implantation step with an energy of at least 500 keV;
removing the mask layer after the ion implantation;
dicing the semiconductor devices after the mask layer is removed; and
coating, prior to applying the mask layer, the top surface of the semiconductor semi-finished product via a chemical vapor deposition with a passivation layer having a layer thickness of at least 100 nm.

2. The method of fabricating a semiconductor device according to claim 1, wherein the first semiconductor layer and the second semiconductor layer each are formed of a GaAs compound or consist of a GaAs compound.

3. The method of fabricating a semiconductor device according to claim 1, wherein via the ion implantation, a deep region between the top surface up to the first semiconductor layer or a deep region between the top surface and including the second semiconductor layer or a deep region between the top surface up to the substrate layer is amorphized and/or insulated.

4. The method of fabricating a semiconductor device according to claim 1, wherein hydrogen ions and/or helium ions are implanted.

5. The method of fabricating a semiconductor device according to claim 1, wherein during implantation, an acceleration energy of the ions is changed between a minimum value and a maximum value, and wherein the minimum value is at least 50 keV and the maximum value is at most 300 MeV.

6. The method of fabricating a semiconductor device according to claim 1, wherein an implantation dosage during implantation is between $10^{10}$ cm$^{-2}$ and $10^{16}$ cm$^{-2}$.

7. The method of fabricating a semiconductor device according to claim 1, wherein, prior to dicing, the mask layer is removed via a wet etching process.

8. The method of fabricating a semiconductor device according to claim 1, wherein metallic contact surfaces are formed on the top surface and/or on the bottom surface prior to the formation of the mask layer.

9. The method of fabricating a semiconductor device according to claim 1, wherein after the application of the mask layer, a mesa etching process is carried out.

10. The method of fabricating a semiconductor device according to claim 1, wherein the scribe line is amorphized and/or insulated over a width of at least 30 μm and at most 300 μm.

11. The method of fabricating a semiconductor device according to claim 1, wherein a metal is used for the mask layer.

12. The method of fabricating a semiconductor device according to claim 1, wherein, for the mask layer titanium or aluminum is used.

13. A stacked semiconductor device comprising:
a top surface;
a bottom surface; and
at least one side surface that connects the top surface with the bottom surface,
wherein the bottom surface is formed of a substrate layer or a rear side contact layer arranged below the substrate layer,
wherein, on the substrate layer, a first semiconductor layer of a first conductivity type is arranged and on the first semiconductor layer at least one second semiconductor layer of a second conductivity type is arranged, wherein the first and second semiconductor layers are formed of a III-V material or consist of a III-V material,
wherein the first and second conductivity types are different,
wherein the top surface is at least partially formed by a passivation layer,
wherein along the at least one side surface, an amorphized and/or insulating region is formed extending at least to the substrate layer, and
wherein the at least one side surface is perpendicular or substantially perpendicular to a layer stack.

14. The stacked semiconductor device according to claim 13, wherein the first semiconductor layer and the second semiconductor layer each are formed of a GaAs compound or consist of a GaAs compound.

15. The stacked semiconductor device according to claim 13, wherein the depth is at least 0.5 μm or at least 5 μm or at least 30 μm.

16. The stacked semiconductor device according to claim 13, wherein a contact surface on a top surface and/or rear side contact layer has gold, silver and/or palladium.

17. The stacked semiconductor device according to claim 13, wherein the semiconductor device has an overall height of at least 10 μm and at most 1000 μm.

18. A stacked semiconductor device comprising:
a top surface at least partially formed by a passivation layer;
a substrate layer;
a bottom surface formed of the substrate layer or a rear side contact layer arranged below the substrate layer;
at least one side surface that connects the top surface with the bottom surface;
a first semiconductor layer of a first conductivity type arranged on the substrate layer; and
at least one second semiconductor layer of a second conductivity type arranged on the first semiconductor layer,
wherein the first semiconductor layer and the at least one second semiconductor layer are formed of a III-V material or consist of a III-V material, the first semiconductor layer and the at least one second semiconductor layer defining a first height,
wherein the first and second conductivity types are different,
wherein along the at least one side surface, an amorphized and/or insulating region extends from the top surface to at least a distance equal to the first height, and
wherein the at least one side surface is perpendicular or substantially perpendicular to a layer stack.

19. The stacked semiconductor device according to claim 18, wherein the first height defines a vertical distance between the top surface and the bottom surface.

* * * * *